(12) United States Patent
Shin et al.

(10) Patent No.: US 6,512,288 B1
(45) Date of Patent: Jan. 28, 2003

(54) CIRCUIT BOARD SEMICONDUCTOR PACKAGE

(75) Inventors: WonSun Shin, KyungKi-Do (KR); SeonGoo Lee, KyungKi-Do (KR); TaeHoan Jang, Seoul (KR); DoSung Chun, Chacheongsao (TH); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/589,713

(22) Filed: Jun. 7, 2000

(30) Foreign Application Priority Data

| Jun. 7, 1999 | (KR) | 99-9992 |
| Sep. 7, 1999 | (KR) | 99-37925 |
| Sep. 7, 1999 | (KR) | 99-37928 |
| Nov. 1, 1999 | (KR) | 99-48010 |
| Dec. 29, 1999 | (KR) | 99-65126 |

(51) Int. Cl.$^7$ .................................. H01L 23/02
(52) U.S. Cl. ................... 257/678; 257/668; 257/672; 257/676; 257/680; 257/690; 257/723; 257/737; 257/738; 257/774; 257/784; 257/797
(58) Field of Search ................. 257/668, 672, 257/676, 678, 680, 699, 723, 737, 738, 773, 774, 784, 786, 797

(56) References Cited

U.S. PATENT DOCUMENTS

| 4,530,152 A | 7/1985 | Roche et al. | 29/588 |
| 4,707,724 A | 11/1987 | Suzuki et al. | 387/71 |
| 4,756,080 A | 7/1988 | Thorp, Jr. et al. | 29/827 |
| 5,157,480 A | 10/1992 | McShane et al. | 387/74 |
| 5,200,362 A | 4/1993 | Lin et al. | 437/207 |
| 5,273,938 A | 12/1993 | Lin et al. | 437/207 |
| 5,474,957 A | 12/1995 | Urushima | 437/209 |
| 5,474,958 A | 12/1995 | Djennas et al. | 437/211 |
| 5,491,612 A | * 2/1996 | Nicewarner, Jr. | 361/760 |
| 5,604,376 A | 2/1997 | Hamburgen et al. | 257/676 |
| 5,620,928 A | 4/1997 | Lee et al. | 438/118 |
| 5,646,828 A | 7/1997 | Degani et al. | 361/715 |
| 5,652,185 A | 7/1997 | Lee | 437/219 |
| 5,668,405 A | 9/1997 | Yamashita | 257/668 |
| 5,696,666 A | 12/1997 | Miles et al. | 361/764 |
| 5,776,798 A | 7/1998 | Quan et al. | 438/112 |
| 5,819,398 A | * 10/1998 | Wakefield | 29/830 |
| 5,835,355 A | 11/1998 | Dordi | 361/760 |
| 5,854,741 A | * 12/1998 | Shim et al. | 361/813 |
| 5,859,471 A | 1/1999 | Kuraishi et al. | 257/666 |
| 5,866,949 A | * 2/1999 | Schuller | 257/778 |
| 5,894,108 A | 4/1999 | Mostafazadeh et al. | 174/52.4 |

(List continued on next page.)

FOREIGN PATENT DOCUMENTS

| EP | 0 682 365 A1 | * 5/1995 |
| JP | SHO 62-9639 | 1/1987 |
| JP | 11-354682 | * 12/1999 |

*Primary Examiner*—Nathan J. Flynn
*Assistant Examiner*—Ahmed N. Sefer
(74) *Attorney, Agent, or Firm*—Skjerven Morrill LLP

(57) ABSTRACT

A circuit board for semiconductor packages capable of fabricating a large number of semiconductor packages in a single circuit board, the circuit board including: a resin layer in the form of a rectangular sheet with first and second sides, the resin layer having a plurality of through holes arranged in rows and columns sharing a sub slot of a predetermined length as a common boundary to form one sub strip for mounting a semiconductor chip, a plurality of the sub strips being arranged in a row and sharing a main slot of a predetermined length as a common boundary to form one main strip; a plurality of circuit patterns each formed in the resin layer between the through hole of the individual sub strip and the sub slot; and a cover coat coated on the resin layer for the purpose of protecting the circuit patterns against external environments.

18 Claims, 5 Drawing Sheets

U.S. PATENT DOCUMENTS

| | | | |
|---|---|---|---|
| 5,903,052 A | 5/1999 | Chen et al. | 257/706 |
| 6,013,948 A | 1/2000 | Akram et al. | 257/698 |
| 6,034,423 A | 3/2000 | Mostafazadeh et al. | 257/691 |
| 6,034,427 A | 3/2000 | Lan et al. | 257/698 |
| 6,099,677 A | 8/2000 | Logothetis et al. | 156/253 |
| 6,100,804 A | 8/2000 | Brady et al. | 340/572.7 |
| 6,107,689 A | 8/2000 | Kozono | 257/778 |
| 6,127,833 A | 10/2000 | Wu et al. | 324/755 |
| 6,172,419 B1 | 1/2001 | Kinsman | 257/737 |
| 6,257,857 B1 * | 7/2001 | Lee et al. | 425/121 |
| 6,262,490 B1 * | 7/2001 | Hsu et al. | 257/787 |

* cited by examiner

CIRCUIT BOARD SEMICONDUCTOR PACKAGE

BACKGROUND OF THE INVENTION

1. Field of the Invention

The present invention relates generally to a circuit board for making semiconductor packages and, more particularly, to a circuit board that is designed to facilitate mass production of a large number of semiconductor packages on a single circuit board.

2. Description of the Related Art

In general, a circuit board for semiconductor packages has circuit patterns formed on the surface of a base material, such as a resin layer, film or tape. The circuit patterns are coated with a cover coat except where solder connections are subsequently made.

A semiconductor chip is mounted on the circuit board, followed by wire bonding and encapsulation with a sealant for protecting the semiconductor chip against the external environment. The resulting circuit board is provided with input/output means, such as conductive balls or conductive pins, and then mounted on a motherboard.

Examples of known semiconductor packages that are made using a circuit board include a ball grid array semiconductor package, a chip scale semiconductor package, and a micro ball grid array semiconductor package.

It is conventional that only about 5 to 10 semiconductor packages are fabricated on a single circuit board, which is subsequently singulated to make individual packages. This gives a low production yield. In addition, the completed semiconductor packages are thick because the semiconductor chips are mounted on the surface of the circuit board.

Recognition marks, which serve as base points in a process for connecting the semiconductor chips and the circuit patterns of the circuit board, are formed in the circuit patterns in the vicinity of a portion where the semiconductor chips are mounted. Unfortunately, the position is hard to recognize, which results in bondwire connection errors.

Furthermore, there are some cases where cracks or other damage occurs during the process of punching forming slots that serve as a boundary of the respective semiconductor packages.

SUMMARY OF THE INVENTION

It is, therefore, an object of the present invention to provide a circuit board for making semiconductor packages that allows simultaneous fabrication of a large number of semiconductor packages, accurate singulation of the individual packages, and a reduction in the connection (wire bonding) error rate.

It is another object of the present invention to provide a circuit board for making semiconductor packages that facilitates the formation of sub slots which serve as a common boundary of the respective packages and which prevents cracks or damage to the circuit patterns during the process of forming the sub slots.

To achieve the above objects of the present invention and others, one embodiment of the present invention provides a circuit board for making semiconductor packages. The exemplary circuit board includes: a resin layer in the form of a rectangular sheet with first and second sides, the resin layer having plurality of package units each having a through hole and arranged in rows and columns sharing a sub slot of a predetermined length as a common boundary to form one sub strip for mounting a semiconductor chip, a plurality of the sub strips being arranged in a row and sharing a main slot of a predetermined length as a common boundary to form one main strip; a plurality of circuit patterns each formed in the resin layer between the through hole of the individual sub strip and the surrounding sub slots; and a cover coat coated on the resin layer for the purpose of protecting the circuit patterns against external environments.

A metal film can be formed on the first side of the resin layer between the through holes and the sub slots.

Here, each of the circuit patterns includes a plurality of bond fingers which will be connected to the semiconductor chip later, and a plurality of ball lands which will be fused to conductive balls later, wherein the bond fingers and the ball lands are exposed from the cover coat. Also, each of the circuit patterns includes the bond fingers and the ball lands formed on the second side of the resin layer; or alternatively includes the ball lands on the first side of the resin layer, and the bond fingers formed on the second side of the resin layer. The bond fingers are connected to the ball lands through conductive via holes in the latter embodiment.

The resin layer further includes a plurality of notches having a predetermined depth between the plural sub slots located in the periphery of the through hole.

A metal film can also be formed on the first side of the resin layer with the ball lands formed thereon.

The notches are vertical to the lengthwise direction of the individual sub slot.

The resin layer further includes a recognition mark serving as a base point during a wire bonding, between the plural sub slots located in the periphery of the through hole.

The recognition mark may be a circuit pattern in the form of "+".

The circuit board further includes a plurality of ground rings formed on the first side of the resin layer around the periphery of the individual through holes, the ground rings being connected to at least one circuit pattern.

Also, the circuit board further includes a plurality of ground planes exposed from the cover coat in the periphery of the individual sub strips, the ground planes being connected to at least one circuit pattern.

A ground plane can also be formed on the first side of the resin layer with the ball lands formed thereon.

To achieve the above objects of the present invention, there is also provided a circuit board including: a resin layer in the form of a rectangular sheet with first and second sides; a plurality of circuit patterns arranged in rows and columns separated from each other at a predetermined distance in both first and second sides of the resin layer or in either one of the first and second sides, to form one sub strip, a plurality of sub strips being arranged in a row to form one main strip; a conductive bus pattern formed in the first side or the second side of the resin layer between the circuit patterns separated from each other at a predetermined distance in the sub strip, the bus pattern being connected to all end portions of the circuit patterns; and a cover coat of a predetermined thickness coated on a portion of the resin layer where the circuit patterns are formed, and exposing a defined portion of the bus pattern and the resin layer outer than the bus pattern.

Here, the defined portion of the bus pattern and the resin layer outer than the bus pattern exposed from the cover coat is a region that will be punched into the sub slot later.

The defined portion of the bus pattern and the resin layer outer than the bus pattern exposed from the cover coat is larger in area than the sub slot to be formed later.

The coat line of the cover coat accross the circuit lines of the circuit patterns adjacent to the bus pattern has an irregular shape, e.g., a square wave shape.

According to the present invention, a plurality of through holes on which a semiconductor is mounted constitute one sub strip and a plurality of the sub strips are connected in a row to constitute one main strip, as a consequence of which a large number of semiconductor packages are produced on a single circuit board.

A plurality of notches formed in the resin layer between the sub slots in the periphery of the through holes facilitate singulation of the circuit board during a singulation process of the semiconductor packages after an encapsulation process. Also, recognition marks formed in the resin layer between the sub slots allow connection equipment, for example, wire bonding equipment to accurately recognize the positions of the semiconductor chips and the circuit board, thereby providing an accurate wire bonding (electrical connection) between the semiconductor chips and the circuit board.

Furthermore, because there is not cover coat applied to a portion where the sub slots will be formed later, prior to forming the sub slots in the circuit board, the sub slot forming (punching) process can be easily performed without a crack or damage in the peripherals of the portion.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION

Embodiments of the present invention will be described hereinbelow with reference to the accompanying drawings. In the following description, well-known functions or constructions are not described in detail since they would obscure the invention in unnecessary detail.

Figure 1A:
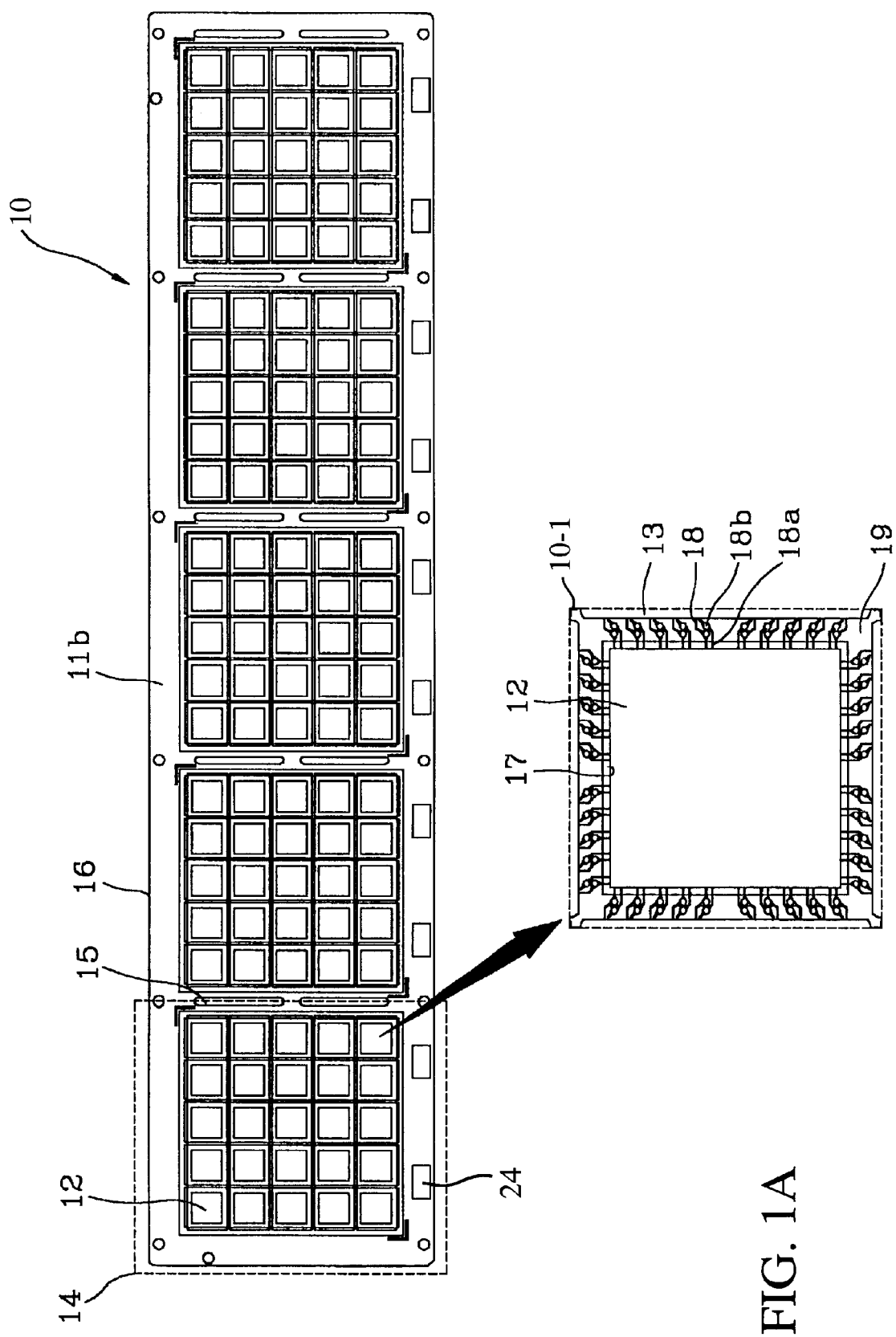
FIGS. 1A–1C are plan views and bottom views of a circuit board according to the present invention.
Figure 1B:
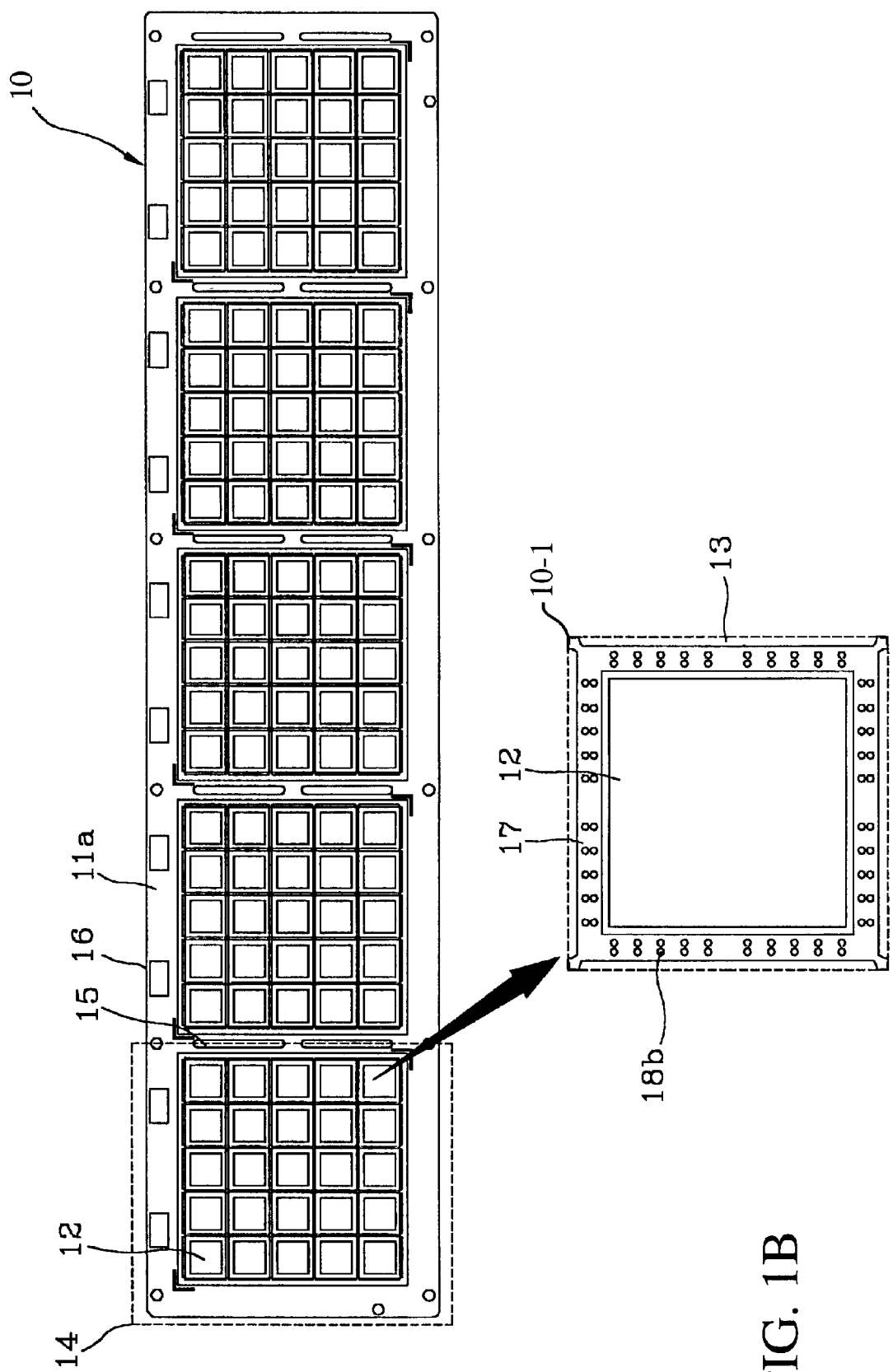
Figure 1C:
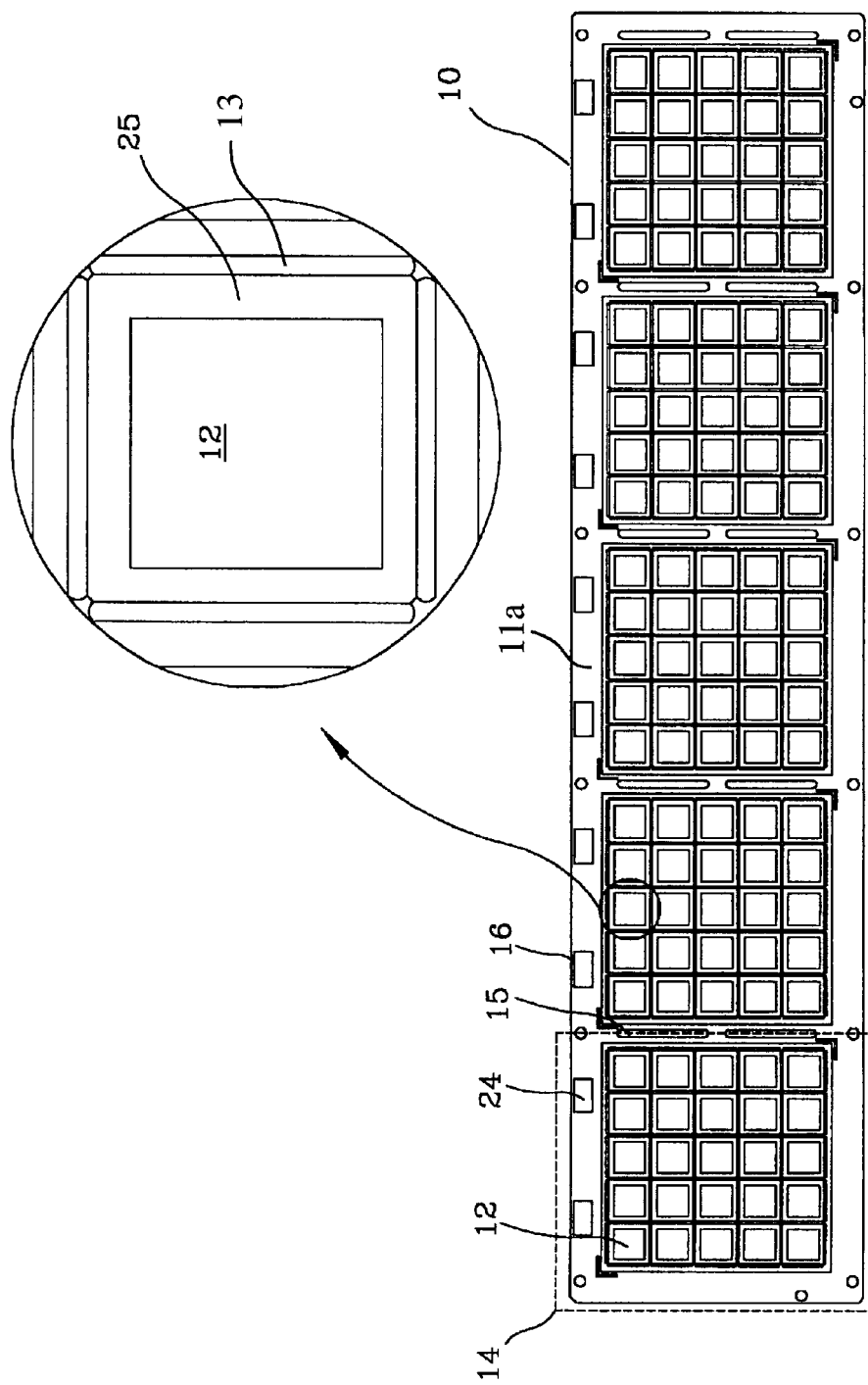
Figure 2A:
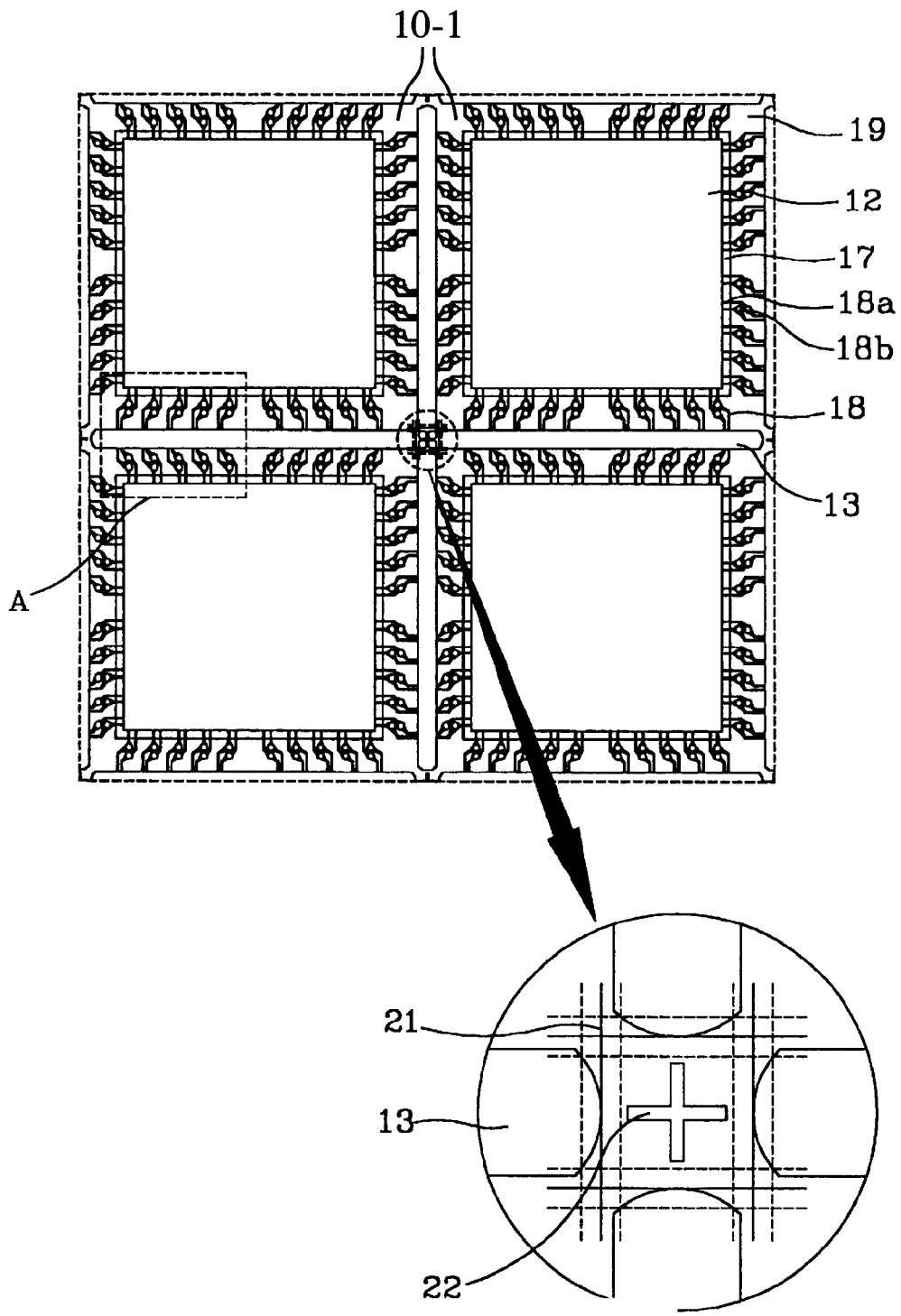
FIG. 2A is an enlarged plan view of a portion where the edges of the respective sub slots meet together in the circuit board according to the present invention.
Figure 2B:
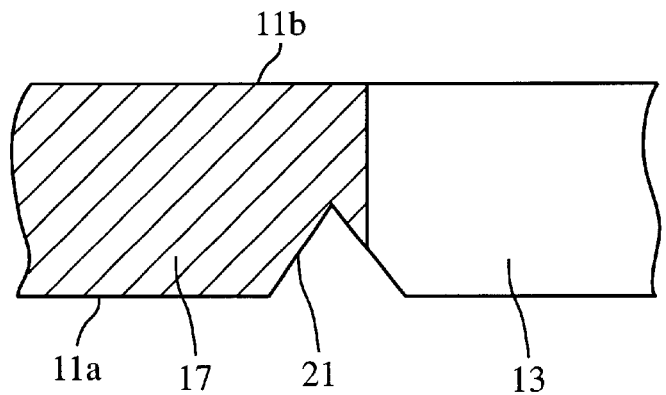
FIG. 2B is a cross-sectional view of the portion shown in FIG. 2A.

FIGS. 1A–1C are plan views and bottom views of a circuit board 10 according to the present invention. FIG. 2A is an enlarged plan view of a portion where the edges of each sub slot 13 meet together in the circuit board 10 of the present invention, and FIG. 2B is a cross-sectional view of the portion.

The circuit board 10 of the present invention comprises a resin layer (in the form of film or tape) 17, circuit patterns 18, and an insulative cover coat 19. The resin layer 17 has a shape of rectangular sheet with opposing first and second sides 11a and 11b.

Circuit board 10 includes a plurality of 10 rectangular package units 10-1. Each package unit 10-1 will form the internal circuit board of a singulated semiconductor package. Package units 10-1 each have a through hole 12. A semiconductor chip will be mounted in each through hole, and suspended therein by a cover member, such as a removable tape, until an encapsulant material is applied to the chip and the respective package unit 10-1. When the encapsulant material hardens, the encapsulant material will support the respective chip in through hole 12.

Package units 10-1 and through holes 12 are arranged in rows and columns. Four sub slots 13 surround each package unit 10-1, one at each of the four sides of package units 10-1. Adjacent package units 10-1 are separated by and share a common sub slot 13.

Package units 10-1 are grouped into rectangular sub strips 14, each including rows and columns of package units 10-1. A plurality of the sub strips 14 are connected in a row and share a main slot 15 of a predetermined length as a common boundary, to form one main strip 16. In the exemplary embodiment of FIG. 1A, circuit board 10 includes five sub strips 14, each of which includes twenty five package units 10-1. A main slot 15 separates and is shared between adjacent sub strips 14.

Here, both the sub slot 13 and the main slot 15 are formed through resin layer 17.

The circuit patterns 18 of each package unit 10-1 of circuit board 10 are formed from a known copper film and are provided on resin layer 17 between the respective through hole 12 and the surrounding sub slots 13. Other metals (e.g., copper alloys and aluminum) may be used.

The cover coat 19 is formed from a known polymer resin and is applied to the surfaces of the circuit patterns 18 and the resin layer 17 in order to protect the circuit patterns 18 from the external environments.

Here, each of the circuit patterns 18 of each package unit 10-1 of circuit board 10 includes a plurality of bond fingers 18a, each of which will be connected later to the semiconductor chip, and a plurality of ball lands 18b to which conductive balls will be fused later. The bond fingers 18a and the ball lands 18b are exposed through the cover coat 19, as illustrated in the figures, to enable the metal-to-metal connections. Plating metals such as gold, silver, palladium, and nickel may be used to facilitate soldering.

The circuit patterns 18 may have both the bond fingers 18a and the ball lands 18b on second side 11b of the resin layer 17, as shown in FIG. 1A, or alternatively may have the ball lands 18b on first side 11a of the resin layer 17 and the bond fingers 18a on the second side 11b, as shown in FIG. 1. In the latter embodiment, the bond fingers 18a are connected to the ball lands 18b by conductive metal vias (not shown) that extend vertically through resin layer 17. Although the ball lands 18b are arranged in two rows in the figures, they can also be arranged in three to five rows. There is no particular limitation imposed on the number of rows of the arranged ball lands 18b.

In a further alternative embodiment of FIG. 1A, a rectangular conductive ground ring 25 may be formed on the first side 11a of the resin layer 17 at the periphery of the individual through hole 12 of each package unit 10-1 of circuit board 10, as is shown in FIG. 1C. The ground ring 25 is electrically connected to a circuit line of circuit pattern 18 of the package unit 10-1. Specifically, the ground ring 25 is formed on first side 11a opposite the side (i.e., opposite second side 11b) where the circuit patterns 18, including the bond fingers 18a and the ball lands 18b, are formed. The ground ring 25 is connected to the one or more circuit lines of the circuit patterns 18 through metal via holes (not shown) through resin layer 17. This ground ring 25 provides grounding connection to the semiconductor chip and also enhances the rigidity of the entire circuit board 10. Also, the ground ring 25 may be coated with the cover coat 19 or adhered to the surface of the resin layer 17 with an adhesive instead of coating, either of which method is a matter of personal choice of those skilled in the art. Ground ring 25 ultimately may be electrically connected to the exposed backside of the semiconductor chip using, for example, a conductive ink.

Conductive ground planes 24 each having a predetermined area are formed on the surface of the resin layer 17 at the edge of the circuit board strip 10. The ground plane 24 is exposed through the cover coat 19. The ground planes 24 are each electrically connected to all or some of the circuit patterns, and also are electrically connected to the ground ring 25 (if present). Unlike the ground ring 25, the ground plane 24 may be formed on both sides of the resin layer 17 so that the ground plane 24 or the ground ring 25 of the circuit board will come in contact with metal equipment during the process of fabrication, thereby facilitating discharge of any static electricity occurring in the circuit board.

Although the ground ring 25 and the ground plane 24 are preferably formed from a copper film, there is no particular limitation imposed on the materials of the ground ring 25 and the ground plane 24, as long as they have conductivity.

A plurality of notches having a predetermined depth may be formed in the resin layer 17 at one or both ends of the sub slots 13 of circuit board 10. The notches may have a direction that is perpendicular to the lengthwise direction of the sub slot 13. An exemplary notch 21 having a triangular shape is shown in FIG. 2B. Notch 21 of FIG. 2B is formed in first side 11a of resin layer and extends vertically into resin layer 17. Alternatively, notch 21 may be formed at second side 11b of the resin layer 17, or at both first side 11a and second side 11b of resin layer 17. Formation of the notches 21 facilitates cutting of the circuit board 10 during a subsequent singulation process that separates out individual semiconductor package units.

Referring to FIG. 2A, there are formed recognition marks 22 between the sub slots 13 as a base point for wire bonding during a connection process. Although there is no particular limitation imposed on the shape of the recognition marks 22, the recognition marks 22 preferably have a cruciform shape. The recognition marks 22 are formed at four corners of the through hole 12 so that the base point for wire bonding becomes easy to detect and distinguishable. The material of the recognition marks 22 is preferably the same as that of the circuit patterns 18.

Figure 3:
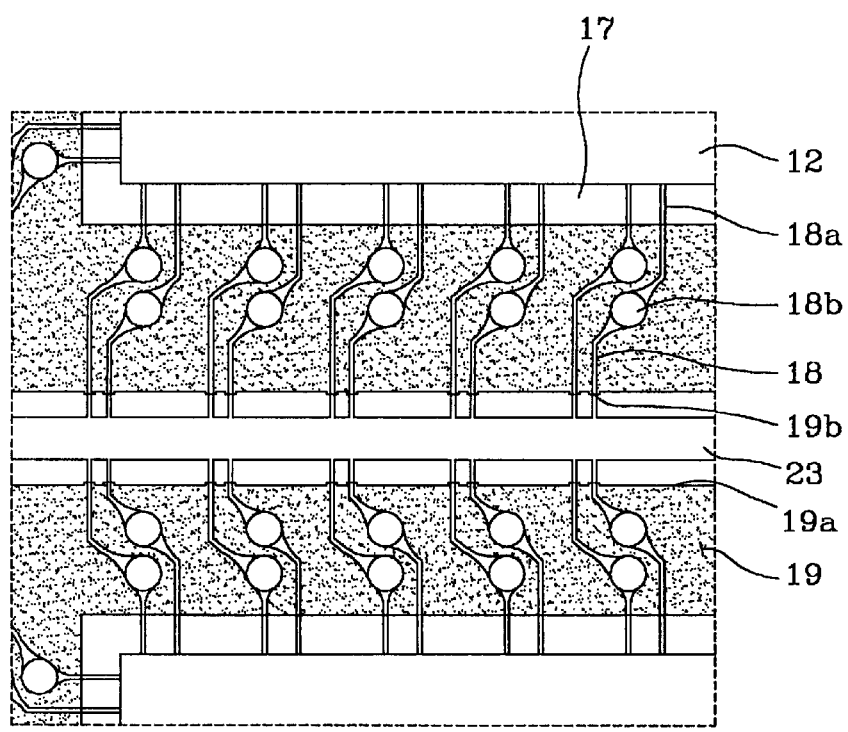
FIG. 3 is an enlarged plan view of portion A of the circuit board segment of FIG. 2A before a sub slot is formed therethrough.

FIG. 3 is a plan view of portion A of the portion of circuit board 10 that is shown in FIG. 2A before the sub slot 13 is formed as a boundary region of any one package unit 10-1. A metal bus pattern 23 that is electrically connected to the circuit patterns 18 of each package unit 10-1 of circuit board 10 is formed on the first side 11a or the second side 11b of the resin layer 17. Bus pattern 23 is laterally between the circuit patterns 18 of adjacent package units 10-1, which are a predetermined distance from each other in the sub strip 14. A defined portion of the bus pattern 23 and the resin layer 17 around the bus pattern 23 are exposed to the outside through the cover coat 19. A large part of the portions exposed through the cover coat 19, including the predefined portion of bus pattern 23, will be punched out later to form the predefined sub slots 13, which are shown in FIGS. 1A, 1B and 2A. The removal of bus pattern 23 electrically isolates the circuit patterns of each of the the package units 10-1, which previously were electrically connected by bus pattern 23.

It is desirable that the portions of bus pattern 23 and the resin layer 17 that are exposed through the cover coat 19 be larger in width than the sub slot 13 to be formed later. Desirably, an edge or coating line 19a of the cover coat 19 where cover coat 19 crosses the circuit lines that connect each circuit patterns 18 to the bus pattern 23 has the shape of an irregular profile. For example, as shown in FIG. 3, coating line 19a may include protruding square portions 19b, resembling a square wave, over the circuit lines, which reinforce the circuit lines during the punching of sub slot 13. Desirably, the resin layer 17 is exposed through the cover coat 19 at the regions where the notches 21 and recognition marks 22 are formed.

Because the cover coat 19 is not present in the region where the sub slot 13 will be formed by punch removal of the bus pattern 23, there is no shock imposed on peripheral areas such as the circuit patterns 18 and the resin layer 17, during formation of the sub slot 13.

As described above, according to the present invention, rows and columns of package units each having a through hole in which a semiconductor chip is to be located constitute one sub strip, and a plurality of the sub strips are connected in a row to constitute one main strip. As a consequence of this structure, a large number of semiconductor packages (subsequently singulated) are produced on a single circuit board during the assembly process.

A plurality of notches formed in the resin layer between the sub slots that are along the periphery of the through holes of each package unit facilitate singulation of the circuit board during a singulation process of the semiconductor packages after an encapsulation process.

Also, recognition marks formed in the resin layer between the sub slots allow connection equipment, for example, wire bonding equipment, to accurately recognize the positions of the semiconductor chips and the circuit board, thereby providing an accurate wire bonding (electrical connection) between the semiconductor chips and the circuit board.

Furthermore, a process of forming (punching out) the sub slot can be easily performed because the cover coat is not applied to a sub slot forming region before the sub slot is formed in the circuit board.

Embodiments of semiconductor packages and methods of making them that may employ the circuit board of the present invention are disclosed in U.S. patent application Ser. No. 09/566,069, entitled "CIRCUIT BOARD FOR SEMICONDUCTOR PACKAGE," which was filed on May 5, 2000; U.S. patent application Ser. No. 09/574,541, entitled "SEMICONDUCTOR PACKAGE AND METHOD FOR FABRICATING THE SAME," which was filed on May 19, 2000 and issued as U.S. Pat. No. 6,395,598; and, U.S. patent application Ser. No. 09/574,006, entitled "SEMICONDUCTOR PACKAGE AND METHOD FOR MANUFACTURING THE SAME," which also was filed on May 19, 2000. All three of these applications are incorporated herein by reference in their respective entireties.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A circuit board for making a plurality of semiconductor packages, the circuit board comprising:
   a resin layer in the form of a rectangular sheet with first and second sides, the resin layer having rows and columns of rectangular package units, each package unit being a site for the formation of one of the semiconductor packages, each package unit having a central through hole and being bounded by a peripheral sub slot of a predetermined length, the package units being grouped in a plurality of rectangular sub strips of the circuit board, the sub strips being arranged in a row, with a main slot of a predetermined length between adjacent sub strips;

a plurality of circuit patterns, each circuit pattern being formed on the resin layer between the through hole of a package unit and the sub slots of the package unit; and an insulative cover coat coated on at least a portion of the circuit pattern of each package unit.

2. The circuit board of claim 1, wherein a metal film is formed on the first side of the resin layer between the respective through hole and the sub slots of the package units.

3. The circuit board of claim 1, wherein each of the circuit patterns comprises a plurality of bond fingers and a plurality of ball lands, wherein at least part of the bond fingers and ball lands are exposed through the cover coat.

4. The circuit board of claim 3, wherein the bond fingers and the ball lands are formed on the second side of the resin layer.

5. The circuit board of claim 3, wherein the ball lands are formed on the first side of the resin layer, and the bond fingers are formed on the second side of the resin layer, and further comprising conductive via holes through the resin layer that are electrically connected between respective bond fingers and ball lands.

6. The circuit board of claim 5, wherein a metal film is formed on the first side of the resin layer adjacent to the ball lands formed thereon.

7. The circuit board of claim 5, wherein a ground ring is formed on the first side of the resin layer adjacent to the ball lands formed thereon.

8. The circuit board of claim 1, wherein the resin layer includes a plurality of notches therein, wherein the notches are located at one or both ends or some or all of the sub slots of the circuit board.

9. The circuit board of claim 8, wherein the notches are oriented in a direction perpendicular to the lengthwise direction of the respective sub slot.

10. The circuit board of claim 1, wherein the resin layer further comprises a plurality of recognition marks each between adjacent corners of the package units.

11. The circuit board of claim 10, wherein each recognition mark is metal and has the form of "+".

12. The circuit board of claim 1, further comprising a plurality of ground rings formed on the first side of the resin layer around the through holes of each package unit, the ground rings each being electrically connected to at least one circuit pattern of the circuit board.

13. The circuit board of claim 1, further comprising a plurality of ground planes exposed through the cover coat at the periphery of the individual sub strips, the ground planes each being electrically connected to at least one circuit pattern of the circuit board.

14. A circuit board comprising:

a resin layer in the form of a rectangular sheet with first and second sides;

a plurality of circuit patterns on one or both of the first and second sides on the resin layer, the circuit patterns being arranged in rows and columns laterally separated from each other, the circuit patterns being grouped into a plurality of rectangular sub strips, the sub strips being arranged in a row to form one main strip;

a removable conductive bus pattern formed on one or both of the first and second sides of the resin layer between the adjacent circuit patterns, the bus pattern being electrically connected between the adjacent circuit patterns; and an insulative cover coat on a portion of the resin layer, the cover coat covering a portion of each of the circuit patterns, wherein a portion of the bus pattern and a first portion of the resin layer between the bus pattern and the adjacent circuit patterns is exposed through the cover coat.

15. The circuit board of claim 14, wherein the exposed portion of the bus pattern and the exposed first portion of the resin layer are removable.

16. The circuit board of claim 14, wherein only part of the exposed portion of the bus pattern and the exposed first portion of the resin layer are removeable.

17. The circuit board of claim 14, wherein an edge of the cover coat over the circuit patterns between the bus pattern and the adjacent circuit pattern has an irregular shape.

18. The circuit board of claim 17, wherein the irregular shape is a square wave shape.

* * * * *